United States Patent
Lang et al.

(10) Patent No.: US 9,138,771 B2
(45) Date of Patent: Sep. 22, 2015

(54) APPARATUS AND METHOD FOR SOLUTION COATING THIN LAYERS

(75) Inventors: Charles D. Lang, Goleta, CA (US); Tami Janene Faircloth, Santa Barbara, CA (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 784 days.

(21) Appl. No.: 12/992,992

(22) PCT Filed: May 19, 2009

(86) PCT No.: PCT/US2009/044487
§ 371 (c)(1),
(2), (4) Date: Nov. 16, 2010

(87) PCT Pub. No.: WO2009/143132
PCT Pub. Date: Nov. 26, 2009

(65) Prior Publication Data
US 2011/0086164 A1    Apr. 14, 2011

Related U.S. Application Data

(60) Provisional application No. 61/054,306, filed on May 19, 2008.

(51) Int. Cl.
*B05D 3/12* (2006.01)
*B05C 5/02* (2006.01)
*B05D 3/04* (2006.01)
B05B 15/02 (2006.01)
H01L 51/00 (2006.01)
H01L 51/56 (2006.01)

(52) U.S. Cl.
CPC ............ *B05C 5/0254* (2013.01); *B05D 3/0493* (2013.01); *B05B 15/0258* (2013.01); *H01L 51/0003* (2013.01); *H01L 51/0004* (2013.01); *H01L 51/56* (2013.01)

(58) Field of Classification Search
CPC  B05B 15/0258; B05C 5/0254; B05D 3/0493; H01L 51/0004
USPC .............. 118/50, 300, 325; 427/58, 294, 350
See application file for complete search history.

(56) References Cited

U.S. PATENT DOCUMENTS

| | | |
|---|---|---|
| 4,356,429 A | 10/1982 | Tang |
| 4,539,507 A | 9/1985 | VanSlyke et al. |
| 5,247,190 A | 9/1993 | Friend et al. |

(Continued)

FOREIGN PATENT DOCUMENTS

| | | |
|---|---|---|
| EP | 1191614 B1 | 6/2009 |
| EP | 1191612 B1 | 9/2009 |

(Continued)

OTHER PUBLICATIONS

CRC Handbook of Chemistry and Physics, 81st Edition (2000-2001) (Book Not Included).

(Continued)

*Primary Examiner* — Alexander Weddle (57) ABSTRACT

An apparatus and method for solution coating layers onto a substrate of an electronic device. A slot die coater in conjunction with a vacuum assist device is used in priming, coating and cleaning stations to produce thin layers having performance advantages over competing technologies.

6 Claims, 2 Drawing Sheets

(56) References Cited

U.S. PATENT DOCUMENTS

| | | | |
|---|---|---|---|
| 5,317,169 | A | 5/1994 | Nakano et al. |
| 5,408,109 | A | 4/1995 | Heeger et al. |
| 5,741,549 | A * | 4/1998 | Maier et al. .............. 427/294 |
| 6,303,238 | B1 | 10/2001 | Thompson et al. |
| 6,426,119 | B1 * | 7/2002 | Yapel et al. .............. 427/335 |
| 6,459,199 | B1 | 10/2002 | Kido et al. |
| 6,475,282 | B1 | 11/2002 | Snodgrass et al. |
| 6,670,645 | B2 | 12/2003 | Grushin et al. |
| 2001/0019782 | A1 | 9/2001 | Igarashi et al. |
| 2002/0121638 | A1 | 9/2002 | Grushin et al. |
| 2003/0116881 | A1 | 6/2003 | Nelson et al. |
| 2005/0100677 | A1 * | 5/2005 | Su et al. .............. 427/420 |
| 2005/0150449 | A1 | 7/2005 | Matsunaga et al. |
| 2006/0147618 | A1 * | 7/2006 | Kwon et al. .............. 427/162 |

FOREIGN PATENT DOCUMENTS

| | | |
|---|---|---|
| WO | WO00/70655 | 11/2000 |
| WO | WO01/41512 A1 | 6/2001 |
| WO | WO02/02714 A2 | 1/2002 |
| WO | WO02/15645 A1 | 2/2002 |
| WO | WO02/31896 A2 | 4/2002 |
| WO | WO03/008424 A1 | 1/2003 |
| WO | WO03/040257 A1 | 5/2003 |
| WO | WO03/063555 A1 | 7/2003 |
| WO | WO03/091688 A2 | 11/2003 |
| WO | WO2004/016710 A1 | 2/2004 |
| WO | WO2007/055102 A1 | 5/2007 |

OTHER PUBLICATIONS

Kirk-Othmer Encyclopedia of Chemical Technology, Fourth Edition, vol. 18, pp. 837-860, 1996 Y. Wang.

Kistler, S.F., and Schweizer, P.M., "Liquid Film Coating," Chapman & Hall, 1997. (Book Not Included).

International Search Report, Korean Intellectual Property Office, Daejeon, Republic of Korea, in PCT/US2009/044487, PCT Counterpart to the present U.S. Appl. No. 12/992,992, Hak Woang Lee, Authorized Officer, Jan. 14, 2010.

* cited by examiner

APPARATUS AND METHOD FOR SOLUTION COATING THIN LAYERS

This application is the national phase of PCT International Application Ser. No. PCT/US09/44487 filed May 19, 2009, and claims the priority right of Provisional Application Ser. No. 61/054,306 filed May 19, 2008 by applicants herein.

FIELD OF THE DISCLOSURE

This disclosure relates in general to a process for making an electronic device. In particular, it relates to a method and apparatus for solution coating layers using a slot die coater in conjunction with a vacuum assist device.

BACKGROUND INFORMATION

Increasingly, active organic molecules are used in electronic devices. These active organic molecules have electronic or electro-radiative properties including electroluminescence. Electronic devices that incorporate organic active materials may be used to convert electrical energy into radiation and may include a light-emitting diode, light-emitting diode display, or diode laser.

Two methods are commonly used to prepare organic light-emitting diode ("OLED") displays: vacuum deposition, and solution processing. (The latter includes all forms of applying the layers from a fluid, as a true solution or a suspension.) Vacuum deposition equipment typically has very high investment costs, and inferior material utilization (high operating costs), so solution processing is preferred, especially for large area displays.

Liquid processes for the deposition of organic active layers include any number of technologies for control of layer thickness on a substrate. Some of these technologies include self regulated methods to control thickness, including spin coating, rod coating, dip coating, roll coating, gravure coating or printing, lithographic or flexographic printing, screen coating or printing, etc. Other of these technologies seek to control deposition thickness using controlled deposition techniques including ink jet printing, spray coating, nozzle coating, slot die coating, curtain coating, bar or slide coating, etc.

Self regulated techniques present a number of drawbacks. Fluids used in coating OLED displays are often applied over surfaces with topography—electrodes, contact pads, thin film transistors, pixel wells formed from photoresists, cathode separator structures, etc. The uniformity of the wet layer deposited by a self regulated technique depends on the coating gap and resulting pressure distribution, so variations in the substrate topography result in undesirable variations in the wet coating thickness. Self regulated techniques generally accrue higher operating costs in that not all the fluid presented to the substrate is deposited. Some fluid is either recycled in the fluid bath (e.g., dip coating), or on the applicator (e.g., roll or gravure coating), or, it is wasted (e.g., spin coating). Solvent evaporates from the recycled fluid, requiring adjustment to maintain process stability. Wasting material, and recycling and adjusting material, add costs.

Controlled techniques can provide lower operating cost. However, in some cases, poor wetting of underlying organic layers may lead to thickness variations or even voids within the organic active layer. Inconsistent formation of organic active layers typically leads to poor device performance and poor yield in device fabricating processes.

There continues to be a need for improved processes for the solution deposition of organic active materials.

SUMMARY OF THE DISCLOSURE

In a controlled coating method all the fluid supplied to the coating applicator is applied to the substrate or workpiece. The average wet coating thickness can be calculated a priori from the volumetric flow rate of the coating fluid, the coated width, and the speed at which the substrate moves past the applicator. Fluid properties (e.g., viscosity, surface tension) and external forces (e.g., gravity) may affect the quality of the coating, but they do not affect the average wet thickness. Of particular interest of the controlled coating methods is the slot die coating method, in particular, when used in conjunction with a vacuum assist device.

Slot die coating has many variations, including design of the die itself, orientation of the die to the web, "on roll" versus "off roll", "patch coating" versus "continuous coating", "stripe coating", and the method of generating the pressure which forces liquid out of the die. Slot die coating is generally recognized to be coating with a die "against" a web, in which the die is actually separated from the web by a cushion of liquid being coated. Further discussions of slot die coating and apparatus can be found in, for example, Kistler, S. F., and Schweizer, P. M., "Liquid Film Coating," Chapman & Hall, 1997.

Typical thickness levels associated with conventional slot die coater processes are on the order or tenths of microns when wet, and can dry to final films on the order of a few microns. In contrast, slot die coating of organic layers for fabricating OLED displays produces layers on the order of tens of nanometers thick. Process improvements are required to produce acceptable layer performance at such thin dimensions.

Application of a vacuum to one side of the slot die coater holds the liquid solution in a gap between faces of the slot die coater and the substrate. In addition, the vacuum appears to resist the viscous drag forces associated with the solution. Viscous drag forces are one factor in removing solution from the gap, leading to non-uniform deposition of the layers and resultant poor performance in an electronic device. Several advantages accrue from a reduction in viscous drag forces, including wider process latitude for operation of larger gaps between an edge of the slot die coater and the substrate. Operation at larger gap distances will minimize errors associated with non-uniformities in substrate height and the height of slot die coater above the substrate during relative motion between the slot die coater and the substrate. Operation at the larger gap distances will permit use of a more concentrated or viscous solution, resulting in thinner layers of wet solution with attendant reduction in drying time. Higher coating speeds can be used in response to the lower process sensitivity, the higher throughput resulting in cost savings. An advantage is realized upon startup of the coating process, before the liquid solution has formed a stable bridge between the edge of the slot die coater and the substrate, as any liquid solution withdrawn from the gap can contaminate the trailing surface of the slot die coater, and from streaks in the subsequent layers.

Slot die coating operations include a number of stations to facilitate the coating process, including: a cleaning station, a priming station, a coating station and a traversing die support that moves the slot die coater between the various stations. In addition, a sensing system can be used to measure the distance between the edge of the slot die coater and various surfaces, such as the priming roll surface and substrate surface. A programmable controller can be used to operate and regulate the process.

One possible sequence for the coating operation is outlined below:
1. Load the coating fluid in a supply system to fill the slot die coater. Measure or infer the distance from the edge of the slot die coater to the top tangent of the priming roll.
2. Load the substrate on a chuck that holds it in place. One embodiment is to use a vacuum system with the chuck to prevent the substrate from bowing.
3. Measure or infer the distance from the edge of the slot die coater to the surface of the substrate that will be coated (i.e., the surface facing away from the chuck). Usually the coating is applied vertically downward onto the substrate.
4. Clean the slot die coater in the cleaning station if required.
5. Prime the slot die coater by pumping solution through a slot of the slot die coater and onto the priming roll. The gap between the edge of the slot die coater and the top surface of the priming roll may be the same or different from the gap between the edge of the slot die coater and the substrate. The priming roll is typically rotated so the surface of the priming roll moves past the edge of the slot die coater to receive coating solution. Typically the rotation is in the direction simulating coating the substrate. The surface speed of the priming roll may be the same or different from the coating speed over the substrate.
6. Move the slot die coater to the starting position for coating the substrate, at a starting gap. Flood the coating gap with liquid solution. Adjust the coating gap before or during the initial motion of the slot die coater relative to the substrate.
7. Coat the substrate.
8. Stop liquid solution flow to the slot die coater at or near the end of the desired coating area. Raise the slot die coater from the substrate at or near the end of the desired coating area. Flow rate and gap may be adjusted together or sequentially at the end of coating to achieve a clean break in the coating with no dripping from the slot die coater, while minimizing the amount of substrate lost to non-uniform coating.
9. Optionally allow the substrate to dry in place.
10. Remove the coated substrate from the chuck. Return the die to the cleaning station.
11. Go to step 2 above.

The vacuum system used in the above sequence utilizes a vacuum assist device (VAD) that creates a chamber around a selected station providing a pressure of less than one atmosphere. The combination of the VAD and slot die coater is referred to as a coating assembly. Sealing elements are used in conjunction with the coating assembly to produce the chamber having a designated pressure. The sealing elements provide a controlled leakage where the VAD approaches, but does not touch, the surface within the station (i.e. substrate, priming roll, etc.). In the cleaning station the VAD can remain in place with the slot die coater and vacuum to the VAD is off during the cleaning operation, alternatively, the VAD can be moved away from the slot die coater to accommodate cleaning of the slot die coater. After the cleaning operation a reverse flow of gas (air, nitrogen, etc.) can be sent through the VAD to remove any residual cleaning fluid. When sealing elements are working in conjunction with the coater assembly, a vacuum source of the VAD may be any source of vacuum, such as a blower, pump, evacuated tank or any known means of providing sub-ambient pressure.

Within the priming station, a stationary surface can be used to mimic the substrate, the stationary surface is located near the priming roll and works in conjunction with the coating assembly and sealing elements to provide a static pressure drop across the coating gap while priming the slot coater die.

In one embodiment, the workpiece comprises a substrate (such as glass) useful for an organic electronic device. The term "organic electronic device" or sometimes just "electronic device", is intended to mean a device including one or more organic semiconductor layers or materials. An organic electronic device includes, but is not limited to: (1) a device that converts electrical energy into radiation (e.g., a light-emitting diode, light emitting diode display, diode laser, or lighting panel), (2) a device that detects a signal using an electronic process (e.g., a photodetector, a photoconductive cell, a photoresistor, a photoswitch, a phototransistor, a phototube, an infrared ("IR") detector, or a biosensors), (3) a device that converts radiation into electrical energy (e.g., a photovoltaic device or solar cell), (4) a device that includes one or more electronic components that include one or more organic semiconductor layers (e.g., a transistor or diode), or any combination of devices in items (1) through (4).

DETAILED DESCRIPTION

Figure 1:
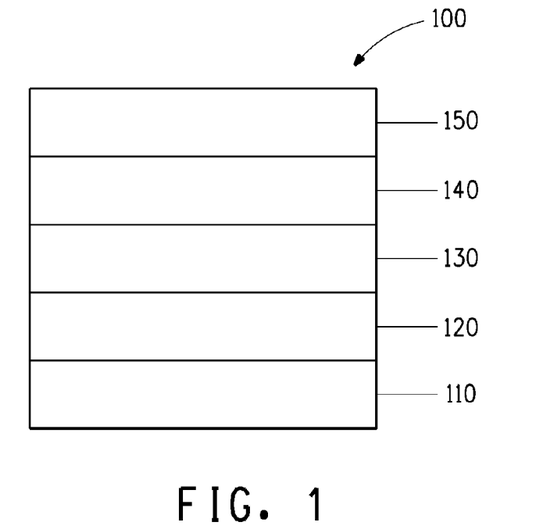
FIG. 1 is an illustration of an electronic device.

One example of an electronic device comprising an organic light-emitting diode ("OLED"), as shown in FIG. 1 and designated 100. The device has an anode layer 110, a buffer layer 120, a photoactive layer 130, and a cathode layer 150. Adjacent to the cathode layer 150 is an optional electron-injection/transport layer 140. Between the buffer layer 120 and the photoactive layer 130, is an optional hole-injection/transport layer (not shown).

As used herein, the term "buffer layer" or "buffer material" is intended to mean electrically conductive or semiconductive materials and may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device. Buffer materials may be polymers, oligomers, or small molecules, and may be in the form of solutions, dispersions, suspensions, emulsions, colloidal mixtures, or other compositions. The term "hole transport" when referring to a layer, material, member, or structure, is intended to mean such layer, material, member, or structure facilitates migration of positive charges through the thickness of such layer, material, member, or structure with relative efficiency and small loss of charge. The term "electron transport" when referring to a layer, material, member or structure, is intended to mean such a layer, material, member or structure that promotes or facilitates migration of negative charges through such a layer, material, member or structure into another layer, material, member or structure. The term "hole injection" when referring to a layer, material, member, or structure, is intended to mean such layer, material, member, or structure facilitates injection and migration of positive charges through the thickness of such layer, material, member, or structure with relative efficiency and small loss of charge. The term "electron injection" when referring to a layer, material, member, or structure, is intended to mean such layer, material, member, or structure facilitates injection and migration of negative charges through the thickness of such layer, material, member, or structure with relative efficiency and small loss of charge.

The device may include a support or substrate (not shown) that can be adjacent to the anode layer 110 or the cathode layer 150. Most frequently, the support is adjacent the anode layer 110. The support can be flexible or rigid, organic or inorganic. Generally, glass or flexible organic films are used as a support. The anode layer 110 is an electrode that is more efficient for injecting holes compared to the cathode layer 150. The anode can include materials containing a metal, mixed metal, alloy, metal oxide or mixed oxide. Suitable materials include the mixed oxides of the Group 2 elements (i.e., Be, Mg, Ca, Sr, Ba, Ra), the Group 11 elements, the elements in Groups 4, 5, and 6, and the Group 8-10 transition elements. If the anode layer 110 is to be light transmitting, mixed oxides of Groups 12, 13 and 14 elements, such as indium-tin-oxide, may be used. As used herein, the phrase "mixed oxide" refers to oxides having two or more different cations selected from the Group 2 elements or the Groups 12, 13, or 14 elements. Some non-limiting, specific examples of materials for anode layer 110 include, but are not limited to, indium-tin-oxide ("ITO"), aluminum-tin-oxide, gold, silver, copper, and nickel. The anode may also comprise an organic material such as polyaniline, polythiophene, or polypyrrole. The IUPAC number system is used throughout, where the groups from the Periodic Table are numbered from left to right as 1-18 (CRC Handbook of Chemistry and Physics, 81$^{st}$ Edition, 2000).

In one embodiment, the buffer layer 120 comprises hole transport materials. Examples of hole transport materials for layer 120 have been summarized for example, in Kirk-Othmer Encyclopedia of Chemical Technology, Fourth Edition, Vol. 18, p. 837-860, 1996, by Y. Wang. Both hole transporting molecules and polymers can be used. Commonly used hole transporting molecules include, but are not limited to: 4,4', 4"-tris(N,N-diphenyl-amino)-triphenylamine (TDATA); 4,4', 4"-tris(N-3-methylphenyl-N-phenyl-amino)-triphenylamine (MTDATA); N,N'-diphenyl-N,N'-bis(3-methylphenyl)-[1,1'-biphenyl]-4,4'-diamine (TPD); 1,1-bis[(di-4-tolylamino) phenyl]cyclohexane (TAPC); N,N'-bis(4-methylphenyl)-N, N'-bis(4-ethylphenyl)-[1,1'-(3,3'-dimethyl)biphenyl]-4,4'-diamine (ETPD); tetrakis-(3-methylphenyl)-N,N,N',N'-2,5-phenylenediamine (PDA); α-phenyl-4-N,N-diphenylaminostyrene (TPS); p-(diethylamino) benzaldehyde diphenylhydrazone (DEH); triphenylamine (TPA); bis[4-(N,N-diethylamino)-2-methylphenyl](4-methylphenyl)methane (MPMP); 1-phenyl-3-[p-(diethylamino) styryl]-5-[p-(diethylamino)phenyl]pyrazoline (PPR or DEASP); 1,2-trans-bis(9H-carbazol-9-yl)cyclobutane (DCZB); N,N,N',N'-tetrakis(4-methylphenyl)-(1,1'-biphenyl)-4,4'-diamine (TTB); N,N'-bis(naphthalen-1-yl)-N,N'-bis-(phenyl)benzidine (α-NPB); and porphyrinic compounds, such as copper phthalocyanine. Commonly used hole transporting polymers include, but are not limited to, poly(9, 9,-dioctyl-fluorene-co-N-(4-butylphenyl)diphenylamine), and the like, polyvinylcarbazole, (phenylmethyl)polysilane, poly(dioxythiophenes), polyanilines, and polypyrroles. It is also possible to obtain hole transporting polymers by doping hole transporting molecules such as those mentioned above into polymers such as polystyrene and polycarbonate.

The photoactive layer 130 may typically be any organic electroluminescent ("EL") material, including, but not limited to, small molecule organic fluorescent compounds, fluorescent and phosphorescent metal complexes, conjugated polymers, and mixtures thereof. Examples of fluorescent compounds include, but are not limited to, pyrene, perylene, rubrene, coumarin, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly (phenylenevinylenes), polyfluorenes, poly(spirobifluorenes), polythiophenes, poly(p-phenylenes), copolymers thereof, and mixtures thereof.

The particular material chosen may depend on the specific application, potentials used during operation, or other factors. The EL layer 130 containing the electroluminescent organic material can be applied using any number of techniques including vapor deposition, solution processing techniques or thermal transfer. In another embodiment, an EL polymer precursor can be applied and then converted to the polymer, typically by heat or other source of external energy (e.g., visible light or UV radiation).

Optional layer 140 can function both to facilitate electron injection/transport, and can also serve as a confinement layer to prevent quenching reactions at layer interfaces. More specifically, layer 140 may promote electron mobility and reduce the likelihood of a quenching reaction if layers 130 and 150 would otherwise be in direct contact. Examples of materials for optional layer 140 include, but are not limited to, include metal chelated oxinoid compounds, such as tris(8-hydroxyquinolato)aluminum (Alq3), bis(2-methyl-8-quinolinolato) (para-phenyl-phenolato)aluminum(III) (BAIQ), and tetrakis-(8-hydroxyquinolinato)zirconium (IV) (ZrQ); and azole compounds such as 2-(4-biphenylyl)-5-(4-t-butylphenyl)-1, 3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole)benzene (TPBI); quinoxaline derivatives such as 2,3-bis(4-fluorophenyl)quinoxaline; phenanthrolines such as 4,7-diphenyl-1,10-phenanthroline (DPA) and 2,9-dimethyl-4,7-diphenyl-1,10-phenanthroline (DDPA); and mixtures thereof. Alternatively, optional layer 140 may be inorganic and comprise BaO, LiF, $Li_2O$, or the like.

The cathode layer 150 is an electrode that is particularly efficient for injecting electrons or negative charge carriers. The cathode layer 150 can be any metal or nonmetal having a lower work function than the first electrical contact layer (in this case, the anode layer 110). As used herein, the term "lower work function" is intended to mean a material having a work function no greater than about 4.4 eV. As used herein, "higher work function" is intended to mean a material having a work function of at least approximately 4.4 eV.

Materials for the cathode layer can be selected from alkali metals of Group 1 (e.g., Li, Na, K, Rb, Cs,), the Group 2 metals (e.g., Mg, Ca, Ba, or the like), the Group 12 metals, the lanthanides (e.g., Ce, Sm, Eu, or the like), and the actinides (e.g., Th, U, or the like). Materials such as aluminum, indium, yttrium, and combinations thereof, may also be used. Specific non-limiting examples of materials for the cathode layer 150 include, but are not limited to, barium, lithium, cerium, cesium, europium, rubidium, yttrium, magnesium, samarium, and alloys and combinations thereof.

In other embodiments, additional layer(s) may be present within organic electronic devices. For example, a layer (not shown) between the buffer layer 120 and the EL layer 130 may facilitate positive charge transport, band-gap matching of the layers, function as a protective layer, or the like. Similarly, additional layers (not shown) between the EL layer 130 and the cathode layer 150 may facilitate negative charge transport, band-gap matching between the layers, function as a protective layer, or the like. Layers that are known in the art can be used. In addition, any of the above-described layers can be made of two or more layers. Alternatively, some or all of inorganic anode layer 110, the buffer layer 120, the EL layer 130, and cathode layer 150, may be surface treated to increase charge carrier transport efficiency. The choice of materials for each of the component layers may be determined by balancing the goals of providing a device with high device efficiency with the cost of manufacturing, manufacturing complexities, or potentially other factors.

The different layers may have any suitable thickness. In one embodiment, inorganic anode layer 110 is usually no greater than approximately 500 nm, for example, approximately 10-200 nm; buffer layer 120, is usually no greater than approximately 250 nm, for example, approximately 50-200 nm; EL layer 130, is usually no greater than approximately 100 nm, for example, approximately 50-80 nm; optional layer 140 is usually no greater than approximately 100 nm, for example, approximately 20-80 nm; and cathode layer 150 is usually no greater than approximately 100 nm, for example, approximately 1-50 nm. If the anode layer 110 or the cathode layer 150 needs to transmit at least some light, the thickness of such layer may not exceed approximately 100 nm. In organic light emitting diodes (OLEDs), electrons and holes, injected from the cathode 150 and anode 110 layers, respectively, into the EL layer 130, form negative and positively charged polar ions in the polymer. These polar ions migrate under the influence of the applied electric field, forming a polar ion exciton with an oppositely charged species and subsequently undergoing radiative recombination. A sufficient potential difference between the anode and cathode, usually less than approximately 12 volts, and in many instances no greater than approximately 5 volts, may be applied to the device. The actual potential difference may depend on the use of the device in a larger electronic component. In many embodiments, the anode layer 110 is biased to a positive voltage and the cathode layer 150 is at substantially ground potential or zero volts during the operation of the electronic device. A battery or other power source(s) may be electrically connected to the electronic device as part of a circuit but is not illustrated in FIG. 1.

Figure 2:
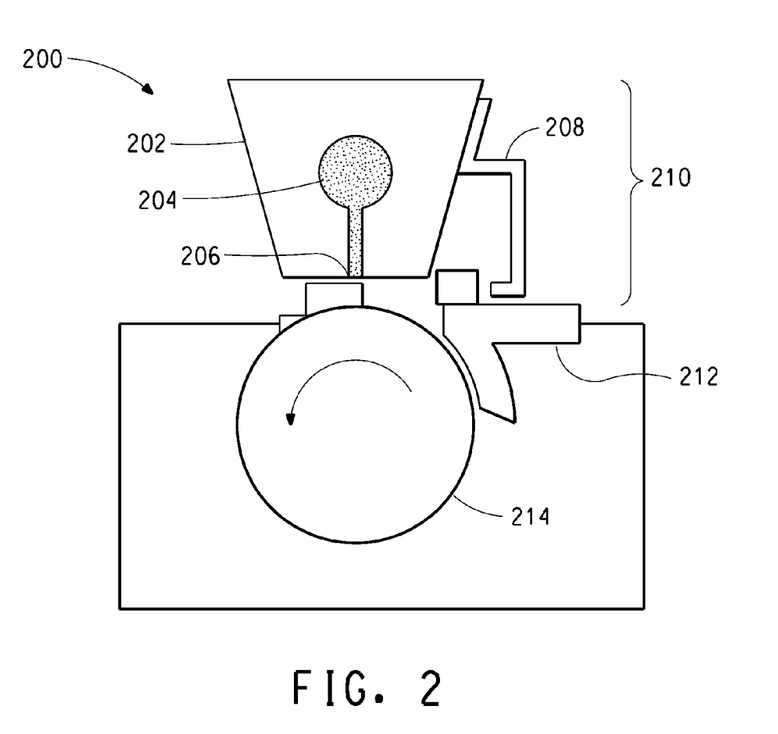
FIG. 2 is an illustration of one embodiment of a priming station of the present invention.

FIG. 2 illustrates one embodiment of a priming station 200. A side view of a slot die coater 202 contains solution 204 fed to an edge 206 of the slot die coater 202. A vacuum assist device (VAD) 208 is shown adjacent the slot die coater 202, and the combination of slot die coater 202 and VAD 208 form coating assembly 210. A priming roll 214 accepts solution 204 to provide a stable web of material prior to the step of coating a substrate (not shown). Sealing elements 212 work in conjunction with the coating assembly 210 to help provide a controlled atmosphere at the upstream side of the slot die coater 202. The sealing elements 212 provide a controlled leakage where the VAD 208 approaches, but does not touch the surface of the priming roll 214.

Figure 3:
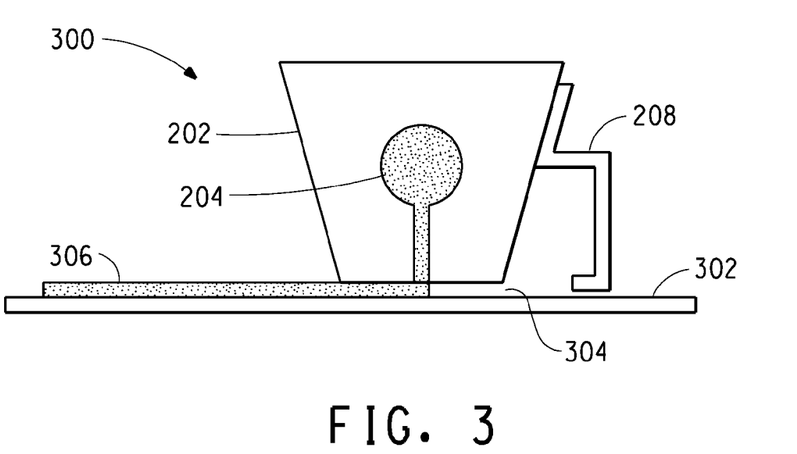
FIG. 3 is an illustration of one embodiment of a coating station of the present invention.

FIG. 3 illustrates one embodiment of a coating station 300 containing slot die coater 202, VAD 208 and a substrate 302.

Sealing elements 212 (not shown) assist VAD 208 to establish a controlled atmosphere on the upstream portion of the die slot coater 202, as a vacuum source (not shown) withdraws air from VAD 208 to create a reduced pressure region on the upstream side of a coating gap 304. A liquid film 306 of solution 204 is applied to substrate 302 and subsequently dried to provide one of the organic layers illustrated in FIG. 1. A slot-shaped opening can be used for one or more layers that may be blanket deposited over substrate 302 or a portion thereof (e.g., an array for the electronic device). In one embodiment, the slot has a width in a range of approximately 5 to 80 microns and a length substantially the same dimension or longer than the corresponding dimension of the substrate or the portion thereof printed using the slot die coater 202. Such an embodiment can be useful for depositing a buffer layer, a charge-blocking layer, a charge-injection layer, a charge-transport layer, or a combination thereof.

Figure 4:
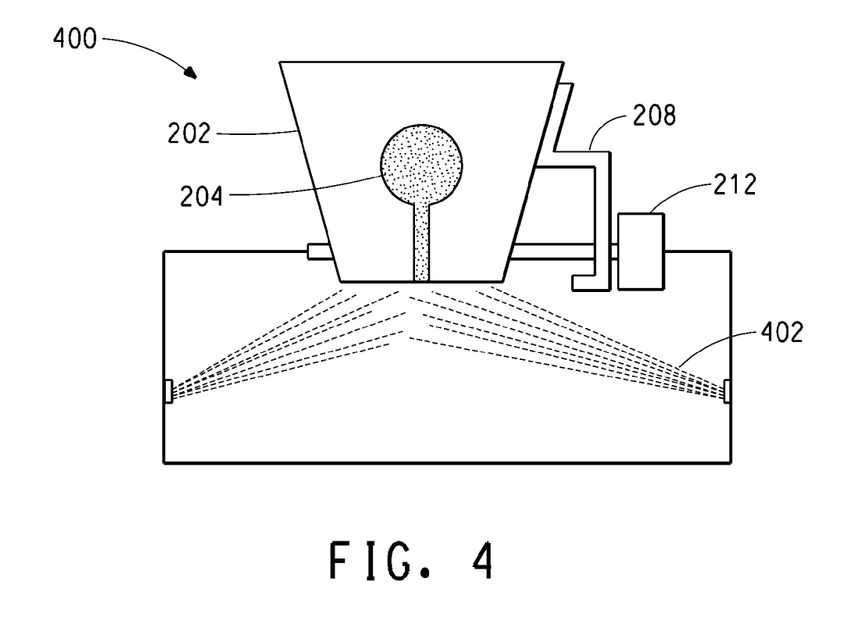
FIG. 4 is an illustration of one embodiment of a cleaning station of the present invention.

FIG. 4 illustrates one embodiment of a cleaning station 400 containing the slot die coater 202, VAD 208, sealing elements 212 and a solvent spray 402 to remove any contaminants from the slot die coater 202. In the cleaning station 400 the VAD 208 can remain in place with the slot die coater 202, as shown in FIG. 4., with vacuum to the VAD 208 turned off during the cleaning operation. Alternatively, the VAD 208 can be moved away (not shown) from the slot die coater 202 when located within the cleaning station 400. After the cleaning operation a reverse flow of gas (air, nitrogen, etc.) can be sent through the VAD 208 to remove any residual cleaning solvent.

A traversing device (not shown) can be used to transfer the coating assembly 210 between priming station 200, coating station 300 and cleaning station 400.

In one embodiment not shown in FIG. 3, a process for forming an electronic device includes placing the substrate 302 onto a chuck (not shown), and printing the layer 306 onto the substrate 302 and at least one exposed portion of the chuck. The chuck supports, holds, or retains the substrate 302. The substrate 302 can be held in place by clamps or pins, by one or more adhesive films, by vacuum, electrostatically, or any combination thereof.

Several variables are used in the coating process to improve yields and final performance of the electronic device. A coating gap of 50-200 μm, a coating velocity of 50-200 mm/s, flow rate 5-600 μl/s, offset from coating height 0-150 μm (gap setting to form a bead), delay 1 of 0.1-10.0 s (dwell time at offset from the coat height) and delay 2 of (0.1-10.0 s (dwell time at the coating gap to stretch and stabilize the bead before coating). A solids content of 0.10-15%, viscosity of 1-100 cp, and a surface tension of 20-72 dynes/cm for the liquid solution 204.

In a further embodiment, the liquid solution 204 has a viscosity no greater than 50 centipoise. In still a further embodiment, the liquid solution includes a liquid medium, wherein the liquid medium includes at least two solvents. In yet a further embodiment, at least one of the solvents is water.

Additional equipment may reside within or be used with the slot die coater 202, including containers and feed lines fluidly coupled to the slot die coater 202 to accommodate any number of constituents to form the solution 204. Other equipment can include any one or more stepper motors, pumps, filters, air handling equipment, control electronics, other electrical, mechanical, or electro-mechanical assemblies or subassemblies, facilities connections, or any combination thereof.

During the coating operation, the pressure within the slot die coater 202 can be in a range of approximately 10 to 350 KPa. The flow rate of solution 204 from the slot die coater 202 can be in a range of 5 to 600 microliters per minute. In other embodiments, a higher or lower pressure, a higher or lower flow rate, or any combination thereof can also be used. After reading the specification, skilled artisans will be able to adjust or modify the priming and coating operations, 200 and 300 respectively, to achieve pressures and flow rates for their particular applications.

The coating station 200 can be adjusted to allow a much greater range in distance between the substrate 302 and the edge 206 of the slot die coater 202. While an actual upper limit is unknown, in one embodiment, the distance between the substrate 302 and the edge 206 does not exceed approximately 2.0 mm. At distances greater than approximately 2 mm the liquid stream coming from the slot die coater 202 may start to diverge before reaching the substrate 302. When working with small dimensions (e.g., no greater than 50 microns), such divergence may be unacceptable. In still other embodiments, other distances may be used, such as at least 11 microns, or no greater than 0.9 mm. After reading this specification, skilled artisans will appreciate that many other distances between the edge 206 and the substrate 302 can be used and tailored to specific applications and dimensions of electronic components within or on the substrate 302.

3. Liquid Compositions

The coating station 200 can be used to deposit a variety of different materials, including liquid solutions. The following paragraphs include only some but not all of the materials that may be used. In one embodiment, one or more materials for an organic or inorganic layer within an electronic device are formed using the coating station 200.

The coating station 200 is well suited for printing liquid compositions. The coating station 200 allows a wider range of operating parameters and liquid compositions to be used compared to a conventional ink-jet printer. In one embodiment, one or more parameters can affect the flow characteristics of the liquid composition. Viscosity is a parameter that can affect the flow characteristics. The viscosity can be affected by selection of the liquid medium, the solids content within the liquid medium, temperature of the liquid composition, or potentially one or more other factors, or any combination thereof. Viscosity can be affected directly by temperature (viscosity of the liquid medium increases with decreasing temperature or decreases with increasing temperature) or indirectly by changing the evaporation rate of the liquid medium within the liquid composition (i.e., using liquid medium having lower or higher boiling points, changing the temperature of the liquid composition, or a combination thereof). After reading this specification, skilled artisans will appreciate that they have many different ways to allow a significantly larger selection of liquid medium, a larger range of solids concentration of the liquid composition to be used, or a combination thereof.

The liquid solution 204 can be in the form of a solution, dispersion, emulsion, or suspension. In the paragraphs that follow, non-limiting examples of solid materials and liquid medium are given. The solid material(s) can be selected upon the electronic or electro-radiative properties for a subsequently-formed layer. The liquid medium can be selected based on criteria described later in this specification.

When using the coating station 200, the liquid composition may have solid(s) greater than approximately 0.1 weight percent without having to worry about clogging. In one embodiment, the solid(s) content is in a range of approximately 2.0 to 3.0 weight percent. Therefore, the coating station 200 can use a liquid composition having a higher viscosity or lower boiling point compared to a conventional ink-jet printer. Further, the coating station 200 can use a liquid composition having a lower viscosity or higher boiling point compared to a conventional ink-jet printer. Additionally, the liquid medium within a liquid composition does not need to be degassed before printing. For example, a conventional ink-jet printer used for dispensing a conductive organic material within an aqueous solution requires the aqueous solvent to be degassed. However, because coating station 200 allows for more processing margin, degassing of a liquid medium is not required for the proper operation of the coating station 200.

An organic layer printed using the coating station 200 can include an organic active layer, (e.g., a radiation-emitting organic active layer or a radiation-responsive organic active layer), filter layer, buffer layer, charge-injecting layer, charge-transport layer, charge-blocking layer, or any combination thereof. The organic layer may be used as part of a resistor, transistor, capacitor, diode, etc.

For a radiation-emitting organic active layer, suitable radiation-emitting materials include one or more small molecule materials, one or more polymeric materials, or a combination thereof. A small molecule material may include any one or more of those described in, for example, U.S. Pat. No. 4,356,429 ("Tang"); U.S. Pat. No. 4,539,507 ("Van Slyke"); U.S. Patent Application Publication No. US 2002/0121638 ("Grushin"); or U.S. Pat. No. 6,459,199 ("Kido"). Alternatively, a polymeric material may include any one or more of those described in U.S. Pat. No. 5,247,190 ("Friend"); U.S. Pat. No. 5,408,109 ("Heeger"); or U.S. Pat. No. 5,317,169 ("Nakano"). An exemplary material is a semiconducting conjugated polymer. An example of such a polymer includes poly(paraphenylenevinylene) (PPV), a PPV copolymer, a polyfluorene, a polyphenylene, a polyacetylene, a polyalkylthiophene, poly(n-vinylcarbazole) (PVK), or the like. In one specific embodiment, a radiation-emitting active layer without any guest material may emit blue light.

For a radiation-responsive organic active layer, a suitable radiation-responsive material may include a conjugated polymer or an electroluminescent material. Such a material includes, for example, a conjugated polymer or an electro- and photo-luminescent material. A specific example includes poly(2-methoxy,5-(2-ethyl-hexyloxy)-1,4-phenylene vinylene) ("MEH-PPV") or a MEH-PPV composite with CN-PPV.

For a hole-injecting layer, hole-transport layer, electron-blocking layer, or any combination thereof, a suitable material includes polyaniline ("PANI"), poly(3,4-ethylenedioxythiophene) ("PEDOT"), polypyrrole, an organic charge transfer compound, such as tetrathiafulvalene tetracyanoquinodimethane ("TTF-TCQN"), a hole-transport material as described in Kido, or any combination thereof.

For an electron-injecting layer, electron transport layer, hole-blocking layer, or any combination thereof, a suitable material includes a metal-chelated oxinoid compound (e.g., $Alq_3$ or aluminum(III)bis(2-methyl-8-quinolinato)4-phenylphenolate ("BAlq")); a phenanthroline-based compound (e.g., 2,9-dimethyl-4,7-diphenyl-1,10-phenanthroline ("DDPA") or 9,10-diphenylanthracene ("DPA")); an azole compound (e.g., 2-tert-butylphenyl-5-biphenyl-1,3,4-oxadiazole ("PBD") or 3-(4-biphenyl)-4-phenyl-5-(4-t-butylphenyl)-1,2,4-triazole ("TAZ"); an electron transport material as described in Kido; a diphenylanthracene derivative; a dinaphthylanthracene derivative; 4,4-bis(2,2-diphenyl-ethen-1-yl)-biphenyl ("DPVBI"); 9,10-di-beta-naphthylanthracene; 9,10-di-(naphenthyl)anthracene; 9,10-di-(2-naphthyl)anthracene ("ADN"); 4,4'-bis(carbazol-9-yl)biphenyl ("CBP"); 9,10-bis-[4-(2,2-diphenylvinyl)-phenyl]-anthracene ("BDPVPA"); anthracene, N-arylbenzimidazoles (such as "TPBI"); 1,4-bis[2-(9-ethyl-3-carbazoyl)vinylenyl]benzene; 4,4'-bis[2-(9-ethyl-3-carbazoyl)vinylenyl]-1,1'-biphenyl; 9,10-bis[2,2-(9,9-fluorenylene)vinylenyl]anthracene; 1,4-bis[2,2-(9,9-fluorenylene)vinylenyl]benzene; 4,4'-bis[2,2-(9,9-fluorenylene)vinylenyl]-1,1'-biphenyl; perylene, substituted perylenes; tetra-tert-butylperylene ("TBPe"); bis(3,5-difluoro-2-(2-pyridyl)phenyl-(2-carboxypyridyl) iridium III ("F(Ir)Pic"); a pyrene, a substituted pyrene; a styrylamine; a fluorinated phenylene; oxidazole; 1,8-naphthalimide; a polyquinoline; one or more carbon nanotubes within PPV; or any combination thereof.

For an electronic component, such as a resistor, transistor, capacitor, etc., the organic layer may include one or more of thiophenes (e.g., polythiophene, poly(alkylthiophene), alkylthiophene, bis(dithienthiophene), alkylanthradithiophene, etc.), polyacetylene, pentacene, phthalocyanine, or any combination thereof.

Examples of an organic dye include 4-dicyanmethylene-2-methyl-6-(p-dimethyaminostyryl)-4H-pyran (DCM), coumarin, pyrene, perylene, rubrene, a derivative thereof, or any combination thereof.

Examples of an organometallic material include a functionalized polymer comprising one or more functional groups coordinated to at least one metal. An exemplary functional group contemplated for use includes a carboxylic acid, a carboxylic acid salt, a sulfonic acid group, a sulfonic acid salt, a group having an OH moiety, an amine, an imine, a diimine, an N-oxide, a phosphine, a phosphine oxide, a β-dicarbonyl group, or any combination thereof. An exemplary metal contemplated for use includes a lanthanide metal (e.g., Eu, Tb), a Group 7 metal (e.g., Re), a Group 8 metal (e.g., Ru, Os), a Group 9 metal (e.g., Rh, Ir), a Group 10 metal (e.g., Pd, Pt), a Group 11 metal (e.g., Au), a Group 12 metal (e.g., Zn), a Group 13 metal (e.g., Al), or any combination thereof. Such an organometallic material includes a metal chelated oxinoid compound, such as tris(8-hydroxyquinolato)aluminum ($Alq_3$); a cyclometalated iridium or platinum electroluminescent compound, such as a complex of iridium with phenylpyridine, phenylquinoline, or phenylpyrimidine ligands as disclosed in published PCT Application WO 02/02714, an organometallic complex described in, for example, published applications US 2001/0019782, EP 1191612, WO 02/15645, WO 02/31896, and EP 1191614; or any mixture thereof.

An examples of a conjugated polymer includes a poly (phenylenevinylene), a polyfluorene, a poly(spirobifluorene), a copolymer thereof, or any combination thereof.

Selecting a liquid medium can also be an important factor for achieving one or more proper characteristics of the liquid composition. A factor to be considered when choosing a liquid medium includes, for example, viscosity of the resulting solution, emulsion, suspension, or dispersion, molecular weight of a polymeric material, solids loading, type of liquid medium, boiling point of the liquid medium, temperature of an underlying substrate, thickness of an organic layer that receives a guest material, or any combination thereof.

In some embodiments, the liquid medium includes at least one solvent. An exemplary organic solvent includes a halogenated solvent, a hydrocarbon solvent, an aromatic hydrocarbon solvent, an ether solvent, a cyclic ether solvent, an alcohol solvent, a glycol solvent, a glycol ether solvent, an ester or diester solvent, a glycol ether ester solvent, a ketone solvent, a nitrile solvent, a sulfoxide solvent, an amide solvent, or any combination thereof.

An exemplary halogenated solvent includes carbon tetrachloride, methylene chloride, chloroform, tetrachloroethylene, chlorobenzene, bis(2-chloroethyl)ether, chloromethyl ethyl ether, chloromethyl methyl ether, 2-chloroethyl ethyl ether, 2-chloroethyl propyl ether, 2-chloroethyl methyl ether, or any combination thereof.

An exemplary colloidal-forming polymeric acid includes a fluorinated sulfonic acid (e.g., fluorinated alkylsulfonic acid, such as perfluorinated ethylenesulfonic acid) or any combinations thereof.

An exemplary hydrocarbon solvent includes pentane, hexane, cyclohexane, heptane, octane, decahydronaphthalene, a petroleum ether, ligroine, or any combination thereof.

An exemplary aromatic hydrocarbon solvent includes benzene, naphthalene, toluene, xylene, ethyl benzene, cumene (iso-propyl benzene) mesitylene (trimethyl benzene), ethyl toluene, butyl benzene, cymene (iso-propyl toluene), diethylbenzene, iso-butyl benzene, tetramethyl benzene, sec-butyl benzene, tert-butyl benzene, anisole, 4-methylanisole, 3,4-dimethylanisole, or any combination thereof.

An exemplary ether solvent includes diethyl ether, ethyl propyl ether, dipropyl ether, diisopropyl ether, dibutyl ether, methyl t-butyl ether, glyme, diglyme, benzyl methyl ether, isochroman, 2-phenylethyl methyl ether, n-butyl ethyl ether, 1,2-diethoxyethane, sec-butyl ether, diisobutyl ether, ethyl n-propyl ether, ethyl isopropyl ether, n-hexyl methyl ether, n-butyl methyl ether, methyl n-propyl ether, or any combination thereof.

An exemplary cyclic ether solvent includes tetrahydrofuran, dioxane, tetrahydropyran, 4 methyl-1,3-dioxane, 4-phenyl-1,3-dioxane, 1,3-dioxolane, 2-methyl-1,3-dioxolane, 1,4-dioxane, 1,3-dioxane, 2,5-dimethoxytetrahydrofuran, 2,5-dimethoxy-2,5-dihydrofuran, or any combination thereof.

An exemplary alcohol solvent includes methanol, ethanol, 1-propanol, 2-propanol, 1-butanol, 2-butanol, 2-methyl-1-propanol (i.e., iso-butanol), 2-methyl-2-propanol (i.e., tert-butanol), 1-pentanol, 2-pentanol, 3-pentanol, 2,2-dimethyl-1-propanol, 1-hexanol, cyclopentanol, 3-methyl-1-butanol, 3-methyl-2-butanol, 2-methyl-1-butanol, 2,2-dimethyl-1-propanol, 3-hexanol, 2-hexanol, 4-methyl-2-pentanol, 2-methyl-1-pentanol, 2-ethylbutanol, 2,4-dimethyl-3-pentanol, 3-heptanol, 4-heptanol, 2-heptanol, 1-heptanol, 2-ethyl-1-hexanol, 2,6-dimethyl-4-heptanol, 2-methylcyclohexanol, 3-methylcyclohexanol, 4-methylcyclohexanol, or any combination thereof.

A glycol ether solvent may also be employed. An exemplary glycol ether solvent includes 1-methoxy-2-propanol, 2-methoxyethanol, 2-ethoxyethanol, 1-methoxy-2-butanol, ethylene glycol monoisopropyl ether, 1-ethoxy-2-propanol, 3-methoxy-1-butanol, ethylene glycol monoisobutyl ether, ethylene glycol mono-n-butyl ether, 3-methoxy-3-methylbutanol, ethylene glycol mono-tert-butyl ether, propylene glycol monomethyl ether (PGME), dipropylene glycol monomethyl ether (DPGME), or any combination thereof.

An exemplary glycol solvent includes ethylene glycol, propylene glycol, or any combination thereof.

An exemplary glycol ether ester solvent includes propylene glycol methyl ether acetate (PGMEA).

An exemplary ketone solvent includes acetone, methylethyl ketone, methyl iso-butyl ketone, cyclohexanone, isopropyl methyl ketone, 2-pentanone, 3-pentanone, 3-hexanone, diisopropyl ketone, 2-hexanone, cyclopentanone, 4-heptanone, iso-amyl methyl ketone, 3-heptanone, 2-heptanone, 4-methoxy-4-methyl-2-pentanone, 5-methyl-3-heptanone, 2-methylcyclohexanone, diisobutyl ketone, 5-methyl-2-octanone, 3-methylcyclohexanone, 2-cyclohexen-1-one, 4-methylcyclohexanone, cycloheptanone, 4-tert-butylcyclohexanone, isophorone, benzyl acetone, or any combination thereof.

An exemplary nitrile solvent includes acetonitrile, acrylonitrile, trichloroacetonitrile, propionitrile, pivalonitrile, isobutyronitrile, n-butyronitrile, methoxyacetonitrile, 2-methylbutyronitrile, isovaleronitrile, N-valeronitrile, n-capronitrile, 3-methoxypropionitrile, 3-ethoxypropionitrile, 3,3'-oxydipropionitrile, n-heptanenitrile, glycolonitrile, benzonitrile, ethylene cyanohydrin, succinonitrile, acetone cyanohydrin, 3-n-butoxypropionitrile, or any combination thereof.

An exemplary sulfoxide solvent includes dimethyl sulfoxide, di-n-butyl sulfoxide, tetramethylene sulfoxide, methyl phenyl sulfoxide, or any combinations thereof.

An exemplary amide solvent includes dimethyl formamide, dimethyl acetamide, acylamide, 2-acetamidoethanol, N,N-dimethyl-m-toluamide, trifluoroacetamide, N,N-dimethylacetamide, N,N-diethyldodecanamide, epsilon-caprolactam, N,N-diethylacetamide, N-tert-butylformamide, formamide, pivalamide, N-butyramide, N,N-dimethylacetoacetamide, N-methyl formamide, N,N-diethylformamide, N-formylethylamine, acetamide, N,N-diisopropylformamide, 1-formylpiperidine, N-methylformanilide, or any combinations thereof.

A crown ether contemplated includes any one or more crown ethers that can function to assist in the reduction of the chloride content of an epoxy compound starting material as part of the combination being treated according to the invention. An exemplary crown ether includes benzo-15-crown-5; benzo-18-crown-6; 12-crown-4; 15-crown-5; 18-crown-6; cyclohexano-15-crown-5; 4',4"(5")-ditert-butyldibenzo-18-crown-6; 4',4"(5")-ditert-butyldicyclohexano-18-crown-6; dicyclohexano-18-crown-6; dicyclohexano-24-crown-8; 4'-aminobenzo-15-crown-5; 4'-aminobenzo-18-crown-6; 2-(aminomethyl)-15-crown-5; 2-(aminomethyl)-18-crown-6; 4'-amino-5'-nitrobenzo-15-crown-5; 1-aza-12-crown-4; 1-aza-15-crown-5; 1-aza-18-crown-6; benzo-12-crown-4; benzo-15-crown-5; benzo-18-crown-6; bis((benzo-15-crown-5)-15-ylmethyl)pimelate; 4-bromobenzo-18-crown-6; (+)-(18-crown-6)-2,3,11,12-tetra-carboxylic acid; dibenzo-18-crown-6; dibenzo-24-crown-8; dibenzo-30-crown-10; ar-ar'-di-tert-butyldibenzo-18-crown-6; 4'-formylbenzo-15-crown-5; 2-(hydroxymethyl)-12-crown-4; 2-(hydroxymethyl)-15-crown-5; 2-(hydroxymethyl)-18-crown-6; 4'-nitrobenzo-15-crown-5; poly-[(dibenzo-18-crown-6)-co-formaldehyde]; 1,1-dimethylsila-11-crown-4; 1,1-dimethylsila-14-crown-5; 1,1-dimethylsila-17-crown-5; cyclam; 1,4,10,13-tetrathia-7,16-diazacyclooctadecane; porphines; or any combination thereof.

In another embodiment, the liquid medium includes water. A conductive polymer complexed with a water-insoluble colloid-forming polymeric acid can be deposited over a substrate and used as a charge-transport layer.

Many different classes of liquid medium (e.g., halogenated solvents, hydrocarbon solvents, aromatic hydrocarbon solvents, water, etc.) are described above. Mixtures of more than one of the liquid medium from different classes may also be used.

The liquid composition may also include an inert material, such as a binder material, a filler material, or a combination thereof. With respect to the liquid composition, an inert material does not significantly affect the electronic, radiation emitting, or radiation responding properties of a layer that is formed by or receives at least a portion of the liquid composition.

It is to be appreciated that certain features of the invention which are for clarity, described above in the context of separate embodiments, may also be provided in combination in a single embodiment. Conversely, various features of the invention that are, for brevity described in the context of a single embodiment, may also be provided separately or in any subcombination. Further, reference to values stated in ranges include each and every value within that range.

The invention claimed is:

1. A method for solution coating a substrate, the method comprising:
    cleaning a slot die coater;
    sending a reverse flow of gas through a vacuum assist device after cleaning;
    loading the solution into the slot die coater, the slot die coater located adjacent the vacuum assist device to form a coater assembly;
    establishing a first distance between an edge of the slot die coater and a top surface of a priming roll;
    loading the substrate onto a chuck;
    establishing a second distance between the edge of the slot die coater and a top surface of the substrate;
    priming the slot die coater by sending the solution out the slot die coater onto the priming roll;
    positioning the slot die coater at the second distance above the substrate;
    coating the substrate with the solution from the slot die coater; and
    terminating the flow of solution to the substrate.

2. The method of claim 1 further comprising:
    removing the coated substrate from the chuck; and
    moving the coating assembly to a cleaning station.

3. The method of claim 1 further comprising:
    providing a controlled vacuum environment around the substrate during the coating step, wherein sealing elements work in conjunction with the coater assembly to provide the controlled vacuum environment.

4. The method of claim 1 wherein at least one constituent of the solution is a polar solvent.

5. The method of claim 4 wherein the polar solvent is water.

6. The method of claim 5 wherein the solution is a suspension having greater than 0.1% solids content.

* * * * *